(12) United States Patent
Liao et al.

(10) Patent No.: US 11,758,312 B2
(45) Date of Patent: Sep. 12, 2023

(54) SOUND PRODUCING PACKAGE STRUCTURE AND MANUFACTURING METHOD THEREOF

(71) Applicant: XMEMS TAIWAN CO., LTD., Hsinchu County (TW)

(72) Inventors: Hsien-Ken Liao, Taichung (TW); Chiung C. Lo, San Jose, CA (US)

(73) Assignee: XMEMS TAIWAN CO., LTD., Hsinchu County (TW)

( * ) Notice: Subject to any disclaimer, the term of this patent is extended or adjusted under 35 U.S.C. 154(b) by 4 days.

(21) Appl. No.: 17/740,322

(22) Filed: May 9, 2022

(65) Prior Publication Data

US 2022/0386004 A1    Dec. 1, 2022

Related U.S. Application Data

(60) Provisional application No. 63/195,695, filed on Jun. 1, 2021.

(51) Int. Cl.
| | |
|---|---|
| *H04R 25/00* | (2006.01) |
| *H04R 1/04* | (2006.01) |
| *H04R 17/00* | (2006.01) |
| *H04R 31/00* | (2006.01) |
| *H10N 30/20* | (2023.01) |

(52) U.S. Cl.
CPC ............... *H04R 1/04* (2013.01); *H04R 17/00* (2013.01); *H04R 31/006* (2013.01); *H10N 30/2047* (2023.02); *H04R 2201/003* (2013.01)

(58) Field of Classification Search
CPC ............... H04R 1/1058; H04R 1/1016; H04R 2460/11; H04R 19/005; H04R 23/02; H04R 31/006; H04R 1/02
See application file for complete search history.

(56) References Cited

U.S. PATENT DOCUMENTS 10,091,587 B2* 10/2018 Brioschi ............... B06B 1/0292

* cited by examiner

*Primary Examiner* — Amir H Etesam
(74) *Attorney, Agent, or Firm* — Winston Hsu

(57) ABSTRACT

A sound producing package structure includes a first sub-package structure and a second sub-package structure. The first sub-package structure includes a first substrate having a first opening and a first chip including a first membrane, wherein a first cavity is formed between the first membrane and the first substrate. The first sub-package structure and the second sub-package structure are stacked, and the second sub-package structure includes a second substrate and a second chip. The second substrate is connected to the first substrate and has a second opening. The second chip includes a second membrane, wherein a second cavity is formed between the second membrane and the second substrate. A gap, connected to the first opening and the second opening, is formed between the first substrate and the second substrate, such that an ambient of the sound producing package structure, the first cavity and the second cavity are connected.

26 Claims, 8 Drawing Sheets

US 11,758,312 B2

SOUND PRODUCING PACKAGE STRUCTURE AND MANUFACTURING METHOD THEREOF

CROSS REFERENCE TO RELATED APPLICATIONS

This application claims the benefit of U.S. Provisional Application No. 63/195,695, filed on Jun. 1, 2021. The content of the application is incorporated herein by reference.

BACKGROUND OF THE INVENTION

1. Field of the Invention

The present invention relates to a sound producing package structure and a manufacturing method thereof, and more particularly, to a sound producing package structure for protecting a chip having a membrane configured to produce an acoustic wave, and to a manufacturing method thereof.

2. Description of the Prior Art

Since micro sound producing devices, such as MEMS (Micro Electro Mechanical System) microspeakers, can be widely used in various electronic devices due to their small size, the micro sound producing devices are developed rapidly in recent years. For example, a MEMS microspeaker may use a thin film piezoelectric material as actuator and a thin single crystal silicon layer as membrane which are formed by at least one semiconductor process.

However, the micro sound producing devices need to be protected due to their small sizes and fragility structures. Therefore, it is necessary to provide a package structure to protect the micro sound producing devices.

SUMMARY OF THE INVENTION

It is therefore a primary objective of the present invention to provide a sound producing package structure for protecting a chip having a membrane configured to produce sound, and provide a manufacturing method of this sound producing package structure.

An embodiment of the present invention provides a sound producing package structure including a first sub-package structure and a second sub-package structure. The first sub-package structure includes a first substrate having a first opening and a first chip including a first membrane, the first chip is connected to the first substrate, wherein a first cavity is formed between the first membrane and the first substrate. The second sub-package structure is disposed on the first sub-package structure, wherein the first sub-package structure and the second sub-package structure are stacked, and the second sub-package structure includes a second substrate and a second chip. The second substrate is connected to the first substrate and has a second opening, wherein the second opening and the first opening are connected. The second chip includes a second membrane and is connected to the second substrate, wherein a second cavity is formed between the second membrane and the second substrate. A gap, connected to the first opening and the second opening, is formed between the first substrate and the second substrate, such that an ambient of the sound producing package structure, the first cavity and the second cavity are connected.

An embodiment of the present invention further provides a manufacturing method of a sound producing package structure. The manufacturing method includes: manufacturing a first sub-package structure, wherein manufacturing the first sub-package structure includes disposing a first chip on a first substrate, wherein a first opening is formed within the first substrate, and a first cavity is formed between a first membrane of the first chip and the first substrate; manufacturing a second sub-package structure, wherein manufacturing the second sub-package structure includes disposing a second chip on a second substrate, wherein a second opening is formed within the second substrate, and a second cavity is formed between a second membrane of the second chip and the second substrate; connecting the second sub-package structure to the first sub-package structure, wherein the first substrate is connected to the second substrate, and the first substrate and the second substrate are between the first chip and the second chip; and forming a gap between the first substrate and the second substrate. The gap is connected to the first opening and the second opening, such that an ambient of the sound producing package structure, the first cavity and the second cavity are connected.

According to the present invention, the yield rate and the reliability of the sound producing package structure are enhanced, and the SPL of the acoustic wave produced by the sound producing package structure is increased.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
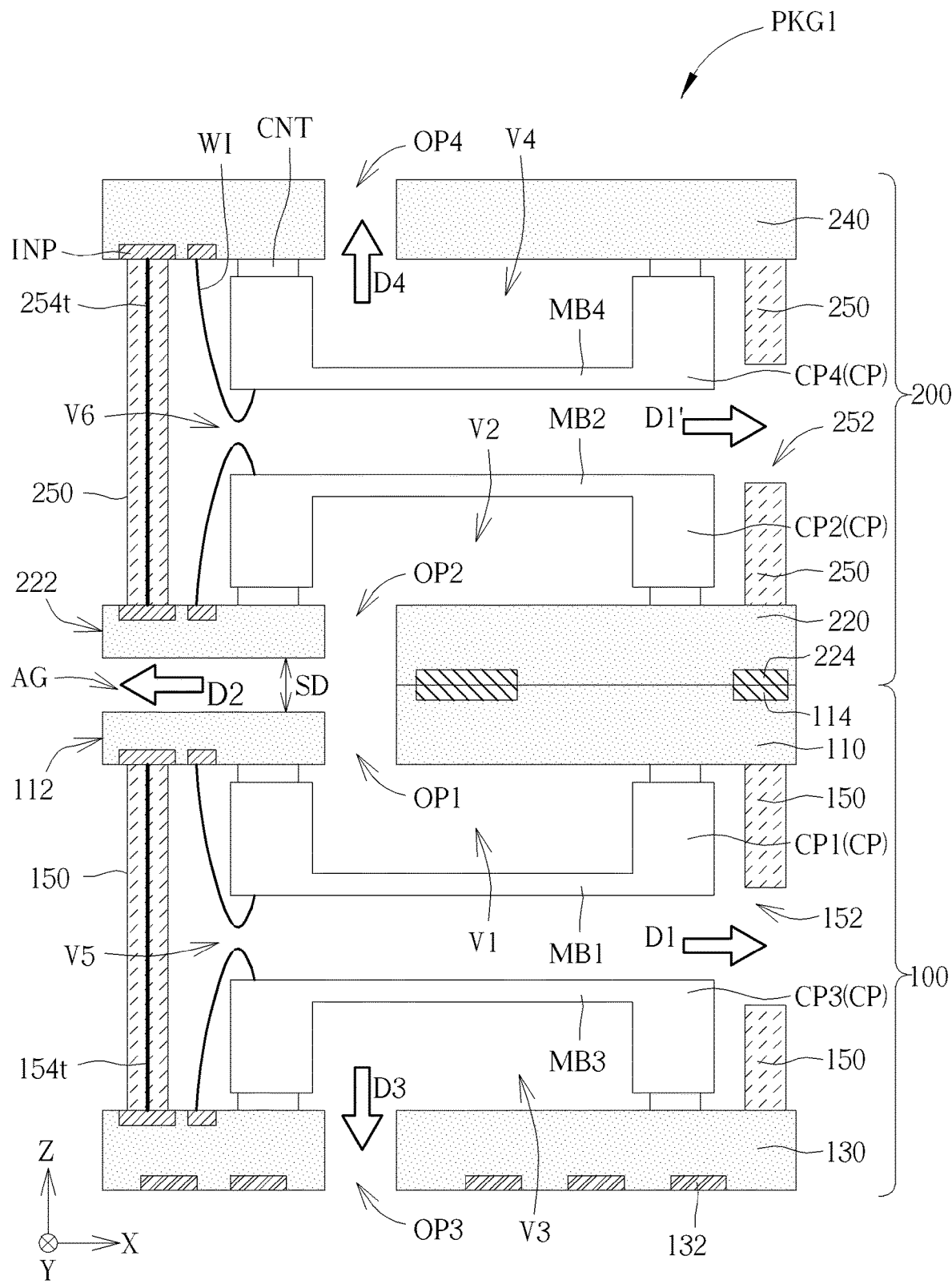
FIG. 1 is a schematic diagram of a cross-sectional view illustrating a sound producing package structure according to a first embodiment of the present invention.

To provide a better understanding of the present invention to those skilled in the art, preferred embodiments and typical material or range parameters for key components will be detailed in the follow description. These preferred embodiments of the present invention are illustrated in the accompanying drawings with numbered elements to elaborate on the contents and effects to be achieved. It should be noted that the drawings are simplified schematics, and the material and parameter ranges of key components are illustrative based on the present day technology, and therefore show only the components and combinations associated with the present invention, so as to provide a clearer description for the basic structure, implementing or operation method of the present invention. The components would be more complex in reality and the ranges of parameters or material used may evolve as technology progresses in the future. In addition, for ease of explanation, the components shown in the drawings may not represent their actual number, shape, and dimensions; details may be adjusted according to design requirements.

In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of the present invention, the corresponding features, areas, steps, operations and/or components would be pointed to existence, but not limited to the existence of one or a plurality of the corresponding features, areas, steps, operations and/or components.

In the following description and in the claims, when "a B1 component is formed by/of C1", C1 exist in the formation of B1 component or C1 is used in the formation of B1 component, and the existence or use of other feature(s), area(s), step(s), operation(s) and/or component(s) is not excluded in the formation of B1 component.

In the following, the term "horizontal direction" generally means a direction parallel to a horizontal surface, the term "horizontal surface" generally means a surface parallel to a direction X and direction Y in the drawings, and the term "vertical direction" generally means a direction parallel to a direction Z in the drawings, wherein the directions X, Y and Z are perpendicular to each other. In the following, the term "top view" generally means a viewing result along the vertical direction, and the term "side view" generally means a viewing result along the horizontal direction.

In the following description and in the claims, the term "substantially" generally means a small deviation may exist or not exist. For instance, the terms "substantially parallel" and "substantially along" means that an angle between two components may be less than or equal to a certain degree threshold, e.g., 10 degrees, 5 degrees, 3 degrees or 1 degree. For instance, the term "substantially aligned" means that a deviation between two components may be less than or equal to a certain difference threshold, e.g., 2 µm or 1 µm. For instance, the term "substantially the same" means that a deviation is within, e.g., 10% of a given value or range, or mean within 5%, 3%, 2%, 1%, or 0.5% of a given value or range.

Although terms such as first, second, third, etc., may be used to describe diverse constituent elements, such constituent elements are not limited by the terms. The terms are used only to discriminate a constituent element from other constituent elements in the specification, and the terms do not relate to the sequence of the manufacture if the specification do not describe. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present invention.

In the present invention, the sound producing package structure may perform an acoustic transformation converting signals (e.g. electric signals or signals with other suitable type) into an acoustic wave. In some embodiments, the sound producing package structure may be a component in a sound producing device, a speaker, a microspeaker or other suitable device, so as to convert the electric signals into the acoustic wave, but not limited thereto. Note that an operation of the sound producing package structure means that the acoustic transformation is performed by the sound producing package structure (e.g., the acoustic wave is produced by actuating a sound producing component in the sound producing package structure with electrical driving signal).

Figure 2:
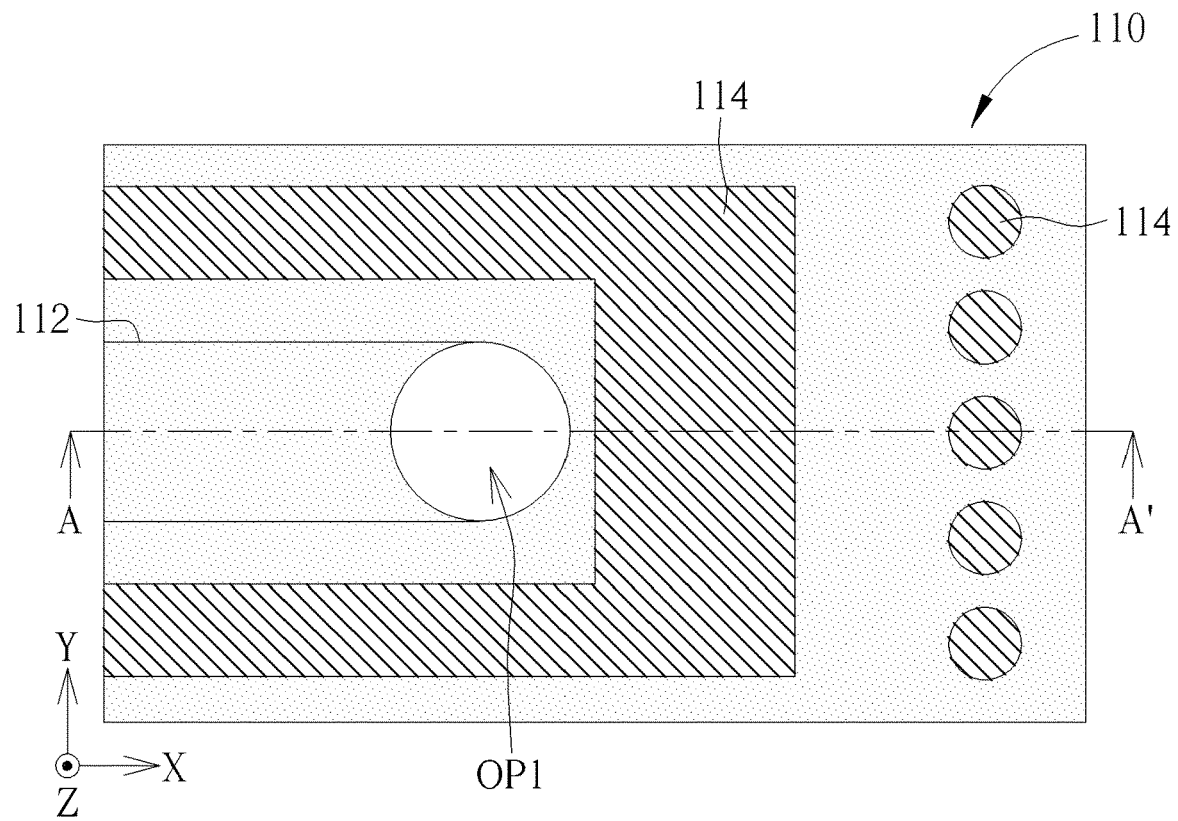
FIG. 2 is a schematic diagram of a top view illustrating a first substrate of a sound producing package structure according to a first embodiment of the present invention.

Referring to FIG. 1 and FIG. 2, FIG. 1 is a schematic diagram of a cross-sectional view illustrating a sound producing package structure according to a first embodiment of the present invention, and FIG. 2 is a schematic diagram of a top view illustrating a first substrate of a sound producing package structure according to a first embodiment of the present invention, wherein the cross sectional view of the first substrate taken along a cross-sectional line A-A' is shown in FIG. 1. As shown in FIG. 1, the sound producing package structure PKG1 may include a plurality of sub-package structures which are stacked, and each sub-package structure may be a packaging component and has at least one sound producing component (e.g., at least one chip having membrane) configured to perform the acoustic transformation. For example, in FIG. 1, the sound producing package structure PKG1 may include two stacked sub-package structures (i.e., a first sub-package structure 100 and a second sub-package structure 200 disposed on the first sub-package structure 100), but not limited thereto. The number of the sub-package structures included in the sound producing package structure PKG1 may be designed based on requirement(s).

As shown in FIG. 1, the first sub-package structure 100 may include a first substrate 110, and the second sub-package structure 200 may include a second substrate 220. Optionally, as shown in FIG. 1, the first sub-package structure 100 may further include a third substrate 130 opposite to the first substrate 110, and the second sub-package structure 200 may further include a fourth substrate 240 opposite to the second substrate 220. The first substrate 110, the second substrate 220, the third substrate 130 and the fourth substrate 240 may be hard or a flexible individually. For instance, the first substrate 110, the second substrate 220, the third substrate 130 and the fourth substrate 240 may individually include silicon, germanium, glass, plastic, quartz, sapphire, polymer, resin, polyimide (PI), polyethylene terephthalate (PET), other suitable material or a combination thereof. Optionally, at least one conductive layer (e.g., at least one metal layer), at least one insulating layer, at least one semiconductor layer or a combination thereof may be included in the first substrate 110, the second substrate 220, the third substrate 130 and/or the fourth substrate 240. For example, at least one of these substrates may be a circuit board including a laminate (e.g. copper clad laminate, CCL), a land grid array (LGA) board or any other suitable board containing conductive material, so as to include conductive component(s) (such as connecting trace(s) and/or bonding pad(s)).

In FIG. 1, the second substrate 220 may be connected to the first substrate 110 to make the first sub-package structure 100 and the second sub-package structure 200 connected to each other. Therefore, the first substrate 110 and the second substrate 220 may be between the third substrate 130 and the fourth substrate 240.

A plurality of chips CP configured to perform the acoustic transformation may be included in the sound producing package structure PKG1. In this embodiment, the first sub-package structure 100 and the second sub-package structure 200 may individually include at least one chip CP. In FIG. 1, the first sub-package structure 100 may include a first chip CP1, and the second sub-package structure 200 may include a second chip CP2. Optionally, the first sub-package structure 100 may further include a third chip CP3, and the second sub-package structure 200 may further include a fourth chip CP4. As shown in FIG. 1, the first chip CP1 and the third chip CP3 may be disposed between the first substrate 110 and the third substrate 130, and the second chip CP2 and the fourth chip CP4 may be disposed between the second substrate 220 and the fourth substrate 240.

As shown in FIG. 1, the first chip CP1 may be connected to the first substrate 110, the second chip CP2 may be connected to the second substrate 220, the third chip CP3 may be connected to the third substrate 130, and the fourth chip CP4 may be connected to the fourth substrate 240. The chip CP may be connected to the substrate through any suitable component. For example, in FIG. 1, the chip CP may be adhered to the substrate through a connecting component CNT and electrically connected to an inner bonding pad INP of the substrate through a conductive wire WI (i.e., the conductive wire WI is formed by a wire bonding process), so as to make the chip CP connected to the substrate, but not limited thereto. Note that the connecting component CNT may include an insulating adhesive material and/or a conductive adhesive material, such as glue, epoxy, die attach film (DAF), dry film and/or solder, but not limited thereto. If the connecting component CNT includes the conductive adhesive material, the chip CP may be electrically connected to a conduct component (e.g., the inner bonding pad INP) of the substrate by the connecting component CNT. In some embodiments (not shown in figures), the conductive wire WI may not exist, and the chip CP may be electrically connected to the inner bonding pad INP of the substrate by the connecting component CNT (e.g., a flip chip package), but not limited thereto.

In FIG. 1, the first chip CP1 may overlap the third chip CP3 in a normal direction of the first substrate 110, and the second chip CP2 may overlap the fourth chip CP4 in the normal direction of the first substrate 110, so as to decrease the lateral sizes of the first sub-package structure 100 and the second sub-package structure 200. Note that the normal direction of the first substrate 110 may be parallel to the direction Z in figures.

The chip CP may include at least one membrane configured to be actuated to produce the acoustic wave. In FIG. 1, the first chip CP1 may include a first membrane MB1, the second chip CP2 may include a second membrane MB2, the third chip CP3 may include a third membrane MB3, and the fourth chip CP4 may include a fourth membrane MB4. In the operation of the sound producing package structure PKG1, the membrane can be actuated to have a movement. In this embodiment, the membrane may be actuated to move upwardly and downwardly, but not limited thereto. Note that, in the present invention, the terms "move upwardly" and "move downwardly" represent that the membrane moves substantially along the direction Z.

The chip CP may include an anchor structure outside the membrane, wherein the membrane is connected to the anchor structure, so as to be anchored by the anchor structure. For example, the membrane may be surrounded by the anchor structure, but not limited thereto. During the operation of the sound producing package structure PKG1, the anchor structure may be immobilized. Namely, the anchor structure may be a fixed end (or fixed edge) respecting the membrane during the operation of the sound producing package structure PKG1.

The membrane and the anchor structure may include any suitable material(s). In some embodiments, the membrane and the anchor structure may individually include silicon (e.g., single crystalline silicon or poly-crystalline silicon), silicon compound (e.g., silicon carbide, silicon oxide), germanium, germanium compound (e.g., gallium nitride or gallium arsenide), gallium, gallium compound or a combination thereof, but not limited thereto. The membrane and the anchor structure may have the same material or different materials.

The chip CP may include an actuator disposed on the membrane and configured to actuate the membrane. Therefore, the membrane may be actuated to move along the direction Z by the actuator, thereby performing the acoustic transformation. Note that, the acoustic wave is produced due to the movement of the membrane actuated by the actuator, and the movement of the membrane is related to a sound pressure level (SPL) of the acoustic wave.

The actuator may have a monotonic electromechanical converting function with respect to the movement of membrane along the direction Z. In some embodiments, the actuator may be a piezoelectric actuator, an electrostatic actuator, a nanoscopic-electrostatic-drive (NED) actuator, an electromagnetic actuator or any other suitable actuator, but not limited thereto. For example, in an embodiment, the actuator may be a piezoelectric actuator, the piezoelectric actuator may contain such as two electrodes and a piezoelectric material layer (e.g., lead zirconate titanate, PZT) disposed between the electrodes, wherein the piezoelectric material layer may actuate the membrane based on driving signals (e.g., driving voltages) received by the electrodes, but not limited thereto. For example, in another embodiment, the actuator may be an electromagnetic actuator (such as a planar coil), wherein the electromagnetic actuator may actuate the membrane based on a received driving signals (e.g., driving current) and a magnetic field (i.e. the membrane may be actuated by the electromagnetic force), but not limited thereto. For example, in still another embodiment, the actuator may be an electrostatic actuator (such as conducting plate) or a NED actuator, wherein the electrostatic actuator or the NED actuator may actuate the membrane based on a received driving signals (e.g., driving voltage) and an electrostatic field (i.e. the membrane may be actuated by the electrostatic force), but not limited thereto.

The actuator may actuate the membrane to produce the acoustic wave based on received driving signal(s). The acoustic wave is corresponding to an input audio signal, and the driving signal applied on the actuator is corresponding to (related to) the input audio signal.

In some embodiments, the acoustic wave, the input audio signal and the driving signal have the same frequency, but not limited thereto. That is to say, the sound producing package structure PKG1 produces a sound at the frequency of sound (i.e., the sound producing package structure PKG1 generates the acoustic wave complying with the zero-mean-flow assumption of classic acoustic wave theorems), but not limited thereto.

Note that the frequency range of the acoustic wave produced by each membrane may be designed based on requirement(s). For instance, an embodiment of membrane may produce the acoustic wave with the frequency range covering the human audible frequency range (e.g., from 20 Hz to 20 kHz), but not limited thereto. For instance, another embodiment of membrane may produce the acoustic wave with the frequency higher than a specific frequency, such that the chip CP including this membrane may be a high frequency sound unit (tweeter), but not limited thereto. For instance, another embodiment of membrane may produce the acoustic wave with the frequency lower than a specific frequency, such that the chip CP including this membrane may be a low frequency sound unit (woofer), but not limited thereto. Note that the specific frequency may be a value ranging from 800 Hz to 4 kHz (e.g., 1.44 kHz), but not limited thereto.

Alternatively, in some embodiments, the driving signals may make the membrane generate a plurality of air pulses, each air pulse has a pulse cycle less than a cycle of the acoustic wave and a cycle of the input audio signal, and one wave of the acoustic wave is reproduced by a plurality of air pulses, wherein the pulse cycle of the air pulse is an inverse/reciprocal of a pulse rate of the air pulses, and the cycle of the acoustic wave and the cycle of the input audio signal are inverses/reciprocals of the frequency of the acoustic wave and the frequency of the input audio signal respectively. In this case, if the lengths of the pulse cycles of the air pulses are the same, the number of the air pulses reproducing one wave of the acoustic wave is decreased as the audio frequency of the acoustic wave is increased. In order to make one wave of the acoustic wave be reproduced by the air pulse with the sufficient number, the pulse rate of the air pulses is higher than a maximum human audible frequency or higher than twice of the maximum human audible frequency (the maximum human audible frequency is generally considered to be 20 kHz), but not limited thereto. Furthermore, in some embodiments, according to Nyquist law, in order to avoid frequency spectral aliasing, the pulse rate of the air pulses needs to be at least twice higher than the maximum frequency of the acoustic wave.

The chips CP in the sound producing package structure PKG1 may be the same or different based on requirement(s). In some embodiments, the first chip CP1 and the second chip CP2 may be the same, and the third chip CP3 and the fourth chip CP4 may be the same and different from the first chip CP1, but not limited thereto. For example, the first membrane MB1 included in the first chip CP1 and the second membrane MB2 included in the second chip CP2 may produce the acoustic wave with the lower frequency, so as to make the first chip CP1 and the second chip CP2 be the low frequency sound units (woofer), but not limited thereto. For example, the third chip CP3 may include two third membranes MB3, the fourth chip CP4 may include two fourth membranes MB4, one of the third membranes MB3 and one of the fourth membranes MB4 may produce the acoustic wave with the lower frequency, and another one of the third membranes MB3 and another one of the fourth membranes MB4 may produce the acoustic wave with the higher frequency, such that both of the third chip CP3 and the fourth chip CP4 may include the high frequency sound unit (tweeter) and the low frequency sound unit (woofer), but not limited thereto.

In some embodiments, the first chip CP1 and the third chip CP3 may be the same, and the second chip CP2 and the fourth chip CP4 may be the same and different from the first chip CP1, but not limited thereto. In some embodiments, all of the chips CP may be the same or different, but not limited thereto.

The chip CP is formed by any suitable manufacturing process. In some embodiments, the chip CP may be formed by at least one semiconductor process, wherein the semiconductor process(es) may be performed on a wafer to form the chip CP, and the wafer may contain silicon (e.g., single crystalline silicon or poly-crystalline silicon), silicon compound (e.g., silicon carbide, silicon oxide), germanium, germanium compound (e.g., gallium nitride or gallium arsenide), gallium, gallium compound, any other suitable material or a combination thereof. For example, the wafer may be a silicon wafer, a silicon on insulator (SOI) wafer, a polysilicon on insulator (POI) wafer, an epitaxial silicon on insulator wafer, or a germanium on insulator (GOI) wafer, but not limited thereto. In some embodiments, the chip CP may be a micro electro mechanical system (MEMS) structure, such that the sound producing package structure PKG1 and the sub-package structure may be a package structure of the MEMS structure, but not limited thereto.

Moreover, the first sub-package structure 100 may further include at least one first wall 150 vertically disposed and connected between the first substrate 110 and the third substrate 130, and the second sub-package structure 200 may further include at least one second wall 250 vertically disposed and connected between the second substrate 220 and the fourth substrate 240 (i.e., a length direction of the first wall 150 and a length direction of the second wall 250 may be perpendicular to direction Z). Thus, a cavity surrounded by the first substrate 110, the third substrate 130 and the first wall 150 may exist in the first sub-package structure 100, and a cavity surrounded by the second substrate 220, the fourth substrate 240 and the second wall 250 may exist in the second sub-package structure 200.

The first wall 150 and the second wall 250 may be a hard substrate or a flexible substrate individually. For instance, the first wall 150 and the second wall 250 may individually include silicon, germanium, glass, plastic, quartz, sapphire, polymer, resin, polyimide (PI), polyethylene terephthalate (PET), other suitable material or a combination thereof. Optionally, at least one conductive layer (e.g., at least one metal layer), at least one insulating layer, at least one semiconductor layer or a combination thereof may be included in the first wall 150 and/or the second wall 250. For example, at least one of these substrates may be a circuit board including a laminate, a land grid array board or any other suitable board containing conductive material, so as to include conductive component(s) (such as connecting trace(s) and/or bonding pad(s)).

As shown in FIG. 1, a cavity V1 may be formed between and directly in contact with the first membrane MB1 of the first chip CP1 and the first substrate 110, a cavity V2 may be formed between and directly in contact with the second membrane MB2 of the second chip CP2 and the second substrate 220, a cavity V3 may be formed between and directly in contact with the third membrane MB3 of the third chip CP3 and the third substrate 130, and a cavity V4 may be formed between and directly in contact with the fourth membrane MB4 of the fourth chip CP4 and the fourth substrate 240. Furthermore, a cavity V5 may be formed between and directly in contact with the first membrane MB1 and the third membrane MB3 (i.e., the cavity V5 may be formed between the first membrane MB1 and the third substrate 130), and a cavity V6 may be formed between and directly in contact with the second membrane MB2 and the fourth membrane MB4 (i.e., the cavity V6 may be formed between the second membrane MB2 and the fourth substrate 240).

For example, in FIG. 1, the cavity V5 may be isolated from the cavity V1 because of the first chip CP1 and be isolated from the cavity V3 because of the third chip CP3, but not limited thereto. For example, in FIG. 1, the cavity V6 may be isolated from the cavity V2 because of the second chip CP2 and be isolated from the cavity V4 because of the fourth chip CP4, but not limited thereto.

As shown in FIG. 1, the first substrate 110 may have a first opening OP1 connected to the cavity V1, and the second substrate 220 may have a second opening OP2 connected to the cavity V2. In some embodiments, the first opening OP1 may be corresponding to the second opening OP2 in the direction Z, but not limited thereto.

A gap AG connected to the first opening OP1 and the second opening OP2 may be formed between the first substrate 110 and the second substrate 220 (i.e., the first opening OP1 and the second opening OP2 may be connected through the gap AG), such that an ambient of the sound producing package structure PKG1 may be connected to the cavity V1 and the cavity V2 through the gap AG, the first opening OP1 and the second opening OP2. Namely, the gap AG existing between the first substrate 110 and the second substrate 220 may form an air channel from the first opening OP1 and the second opening OP2 to a side edge of the first substrate 110 and a side edge of the second substrate 220, such that the ambient of the sound producing package structure PKG1, the cavity V1 and the cavity V2 may be connected through the gap AG. For example, as shown in FIG. 1, in the gap AG, a distance SD between the first substrate 110 and the second substrate 220 may be greater than 300 μm, thereby increasing the effect of the air channel from the cavity V1 and the cavity V2 to the ambient of the sound producing package structure PKG1, but not limited thereto.

As shown in FIG. 1 and FIG. 2, in order to form the gap AG, the first substrate 110 may have a first thinning portion 112 adjacent to the first opening OP1 (i.e., at least a portion of an edge of the first opening OP1 may belong to the first thinning portion 112), such that the gap AG may be formed because of the first thinning portion 112. Optionally, As shown in FIG. 1, the second substrate 220 may also have a second thinning portion 222 adjacent to the second opening OP2 (i.e., at least a portion of an edge of the second opening OP2 may belong to the second thinning portion 222), and the gap AG may be formed because of the first thinning portion 112 and the second thinning portion 222. In FIG. 1, a thickness of the first thinning portion 112 may be less than other portion of the first substrate 110, and a thickness of the second thinning portion 222 may be less than other portion of the second substrate 220. For example, the first thinning portion 112 may be formed by etching a portion of at least one layer of the first substrate 110, and the second thinning portion 222 may be formed by etching a portion of at least one layer of the second substrate 220, but not limited thereto. In some embodiments (as shown in FIG. 1), the first thinning portion 112 may be corresponding to the second thinning portion 222 in the direction Z, such that the gap AG may be formed between the first thinning portion 112 and the second thinning portion 222, but not limited thereto.

As shown in FIG. 1, the third substrate 130 may have a third opening OP3 connected to the cavity V3, and the fourth substrate 240 may have a fourth opening OP4 connected to the cavity V4, such that the cavity V3 may be connected to the ambient of the sound producing package structure PKG1 through the third opening OP3, and the cavity V4 may be connected to the ambient of the sound producing package structure PKG1 through the fourth opening OP4. Moreover, as shown in FIG. 1, a first wall opening 152 connected to the cavity V5 may be formed within the first wall 150, and a second wall opening 252 connected to the cavity V6 may be formed within the second wall 250, such that the cavity V5 may be connected to the ambient of the sound producing package structure PKG1 through the first wall opening 152, and the cavity V6 may be connected to the ambient of the sound producing package structure PKG1 through the second wall opening 252.

The sound producing package structure PKG1 may have at least one front opening and at least one back opening, wherein the acoustic wave produced by the chip CP may propagate outwards to the listener through the front opening (i.e., the front opening serves as a sound outlet), and the back opening may be configured to reduce the acoustic stiffness. For example, the first wall opening 152 and the second wall opening 252 may be two front openings, and the third opening OP3, the fourth opening OP4 and the gap AG connected to the first opening OP1 and the second opening OP2 may be three back openings, but not limited thereto.

In the first sub-package structure 100 of this embodiment (as shown in FIG. 1), the first membrane MB1 and the third membrane MB3 may be configured to generate a first acoustic wave within the cavity V5, and the first acoustic wave may propagate outwards through the first wall opening 152 and toward a first direction D1, wherein the first wall opening 152 formed within the first wall 150 of the first sub-package structure 100 may serve as a sound outlet of the first sub-package structure 100, but not limited thereto.

In the first sub-package structure 100 of this embodiment (as shown in FIG. 1), an air wave may be formed within the cavity V1 when the first membrane MB1 is actuated, and the air wave within the cavity V1 may propagate through the first opening OP1 and the gap AG and toward a second direction D2, wherein the second direction D2 may be opposite to the first direction D1, but not limited thereto. Also, an air wave may be formed within the cavity V3 when the third membrane MB3 is actuated, and the air wave within the cavity V3 may propagate through the third opening OP3 and toward a third direction D3, wherein the third direction D3 may be substantially perpendicular to the first direction D1, but not limited thereto.

In the second sub-package structure 200 of this embodiment (as shown in FIG. 1), the second membrane MB2 and the fourth membrane MB4 may be configured to generate a second acoustic wave within the cavity V6, and the second acoustic wave may propagate outwards through the second wall opening 252 and toward a first direction D1', wherein the second wall opening 252 formed within the second wall 250 of the second sub-package structure 200 and may serve as a sound outlet of the second sub-package structure 200, but not limited thereto. Note that the first direction D1' may be parallel to the first direction D1, but not limited thereto.

In the second sub-package structure 200 of this embodiment (as shown in FIG. 1), an air wave may be formed within the cavity V2 when the second membrane MB2 is actuated, and the air wave within the cavity V2 may propagate through the second opening OP2 and the gap AG and toward the second direction D2, wherein the second direction D2 may be opposite to the first direction D1', but not limited thereto. Also, an air wave may be formed within the cavity V4 when the fourth membrane MB4 is actuated, and the air wave within the cavity V4 may propagate through the fourth opening OP4 and toward a fourth direction D4, wherein the fourth direction D4 may be substantially perpendicular to the first direction D1' (and the first direction D1), but not limited thereto. Note that the fourth direction D4 may be opposite to the third direction D3, but not limited thereto.

In FIG. 1, a plurality of outer connecting pads 132 may be formed within the third substrate 130, the outer connecting pads 132 may be situated on a side of the third substrate 130 opposite to the first substrate 110, and the first substrate 110, the second substrate 220, the fourth substrate 240, the first wall 150 and the second wall 250 may not have the outer connecting pad 132, wherein an outer device outside the sound producing package structure PKG1 may transmit the signal(s) into the sound producing package structure PKG1 through the outer connecting pad 132.

All of the chips CP may be electrically connected to the outer connecting pad 132 of the third substrate 130 through at least one conductive trace/line in the substrate(s).

In some embodiments, the third chip CP3 may be electrically connected to the outer connecting pad 132 through the inner bonding pad INP of the third substrate 130 and at least one trace (not shown in figures) of the third substrate 130, but not limited thereto.

As shown in FIG. 1, the first wall 150 may include at least one first connecting line 154t electrically connected between the inner bonding pad INP of the first substrate 110 and the inner bonding pad INP of the third substrate 130, wherein the first wall 150 may be connected to the first substrate 110 and the third substrate 130 through conductive components (e.g., solder), so as to make the first connecting line 154t electrically connected between two inner bonding pads INP. In some embodiments, the first chip CP1 may be electrically connected to the outer connecting pad 132 through the inner bonding pad(s) INP of the first substrate 110, at least one trace (not shown in figures) of the first substrate 110, the first connecting line(s) 154t and at least one trace (not shown in figures) of the third substrate 130, but not limited thereto.

As shown in FIG. 1, the first substrate 110 may include a first package connecting pad 114 situated on a side of the first substrate 110 close to the second substrate 220, the second substrate 220 may include a second package connecting pad 224 situated on a side of the second substrate 220 close to the first substrate 110, the first package connecting pad 114 and the second package connecting pad 224 may be electrically connected to each other through at least one conductive component (e.g., solder) disposed between the first substrate 110 and the second substrate 220. In some embodiments, the second chip CP2 may be electrically connected to the outer connecting pad 132 through the inner bonding pad INP of the second substrate 220, at least one trace (not shown in figures) of the second substrate 220, the second package connecting pad 224 of the second substrate 220, the conductive component between the first substrate 110 and the second substrate 220, the first package connecting pad 114 of the first substrate 110, at least one trace (not shown in figures) of the first substrate 110, the inner bonding pad(s) INP of the first substrate 110, the first connecting line(s) 154t and at least one trace (not shown in figures) of the third substrate 130, but not limited thereto.

As shown in FIG. 1, the second wall 250 may include at least one second connecting line 254t electrically connected between the inner bonding pad INP of the second substrate 220 and the inner bonding pad INP of the fourth substrate 240, wherein the second wall 250 may be connected to the second substrate 220 and the fourth substrate 240 through conductive components (e.g., solder), so as to make the second connecting line 254t electrically connected between two inner bonding pads INP. In some embodiments, the fourth chip CP4 may be electrically connected to the outer connecting pad 132 through the inner bonding pad(s) INP of the fourth substrate 240, at least one trace (not shown in figures) of the fourth substrate 240, the second connecting line(s) 254t, the inner bonding pad INP of the second substrate 220, at least one trace (not shown in figures) of the second substrate 220, the second package connecting pad 224 of the second substrate 220, the conductive component between the first substrate 110 and the second substrate 220, the first package connecting pad 114 of the first substrate 110, at least one trace (not shown in figures) of the first substrate 110, the inner bonding pad(s) INP of the first substrate 110, the first connecting line(s) 154t and at least one trace (not shown in figures) of the third substrate 130, but not limited thereto.

As shown in FIG. 1, since the sound producing package structure PKG1 has a plurality of chips CP configured to perform the acoustic transformation, the SPL of the acoustic wave may be enhanced. Moreover, since the difficulty of the connection between the chip CP and the substrate is less than the difficulty of the connection between the chip CP and other base, the yield rate of the sound producing package structure PKG1 shown in FIG. 1 is increased.

In the following, the details of a method of manufacturing a sound producing package structure PKG1 will be further exemplarily explained. The following method is exemplary. In some embodiments, some of the following steps may be performed simultaneously or in a different order. In some embodiments, before or after one of the following steps, any other suitable step may be added.

Referring to FIG. 1 and FIG. 3 to FIG. 6, FIG. 3 to FIG. 6 are schematic diagrams illustrating structures at different stages of a manufacturing process of a sound producing package structure according to an embodiment of the present invention, and FIG. 1 shows the accomplished sound producing package structure PKG1 produced by this manufacturing method.

Figure 3:
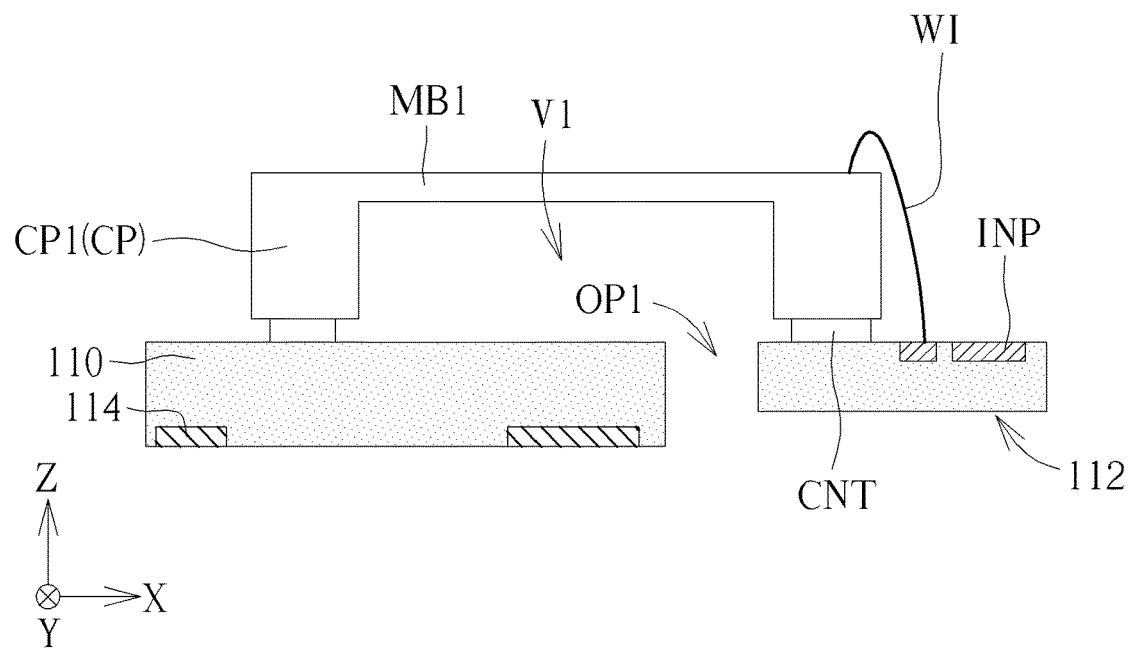
FIG. 3 to FIG. 6 are schematic diagrams illustrating structures at different stages of a manufacturing process of a sound producing package structure according to an embodiment of the present invention.

In the manufacturing method of the sound producing package structure PKG1, a first packaging method is performed to form/manufacture the first sub-package structure 100, and a second packaging method is performed to form/manufacture the second sub-package structure 200. As shown in FIG. 3, in the first packaging method, the first chip CP1 is disposed on and connected to the first substrate 110. For example (as shown in FIG. 3), the first chip CP1 may be adhered to the first substrate 110 through the connecting component CNT and electrically connected to the inner bonding pad INP of the first substrate 110 through the conductive wire WI formed by a wire bonding process, but not limited thereto. For example (not shown in figures), the conductive wire WI may not exist, and the first chip CP1 may be electrically connected to the inner bonding pad INP of the substrate by the connecting component CNT including the conductive adhesive material (e.g., a flip chip CP package), but not limited thereto. Similarly, in the second packaging method, the second chip CP2 is disposed on and connected to the second substrate 220.

Note that the first opening OP1 of the first substrate 110 and the second opening OP2 of the second substrate 220 may be formed in any suitable step. For example, the first opening OP1 may be formed within the first substrate 110 before disposing the first chip CP1 on the first substrate 110, and the second opening OP2 may be formed within the second substrate 220 before disposing the second chip CP2 on the first second substrate 220, but not limited thereto.

Figure 4:
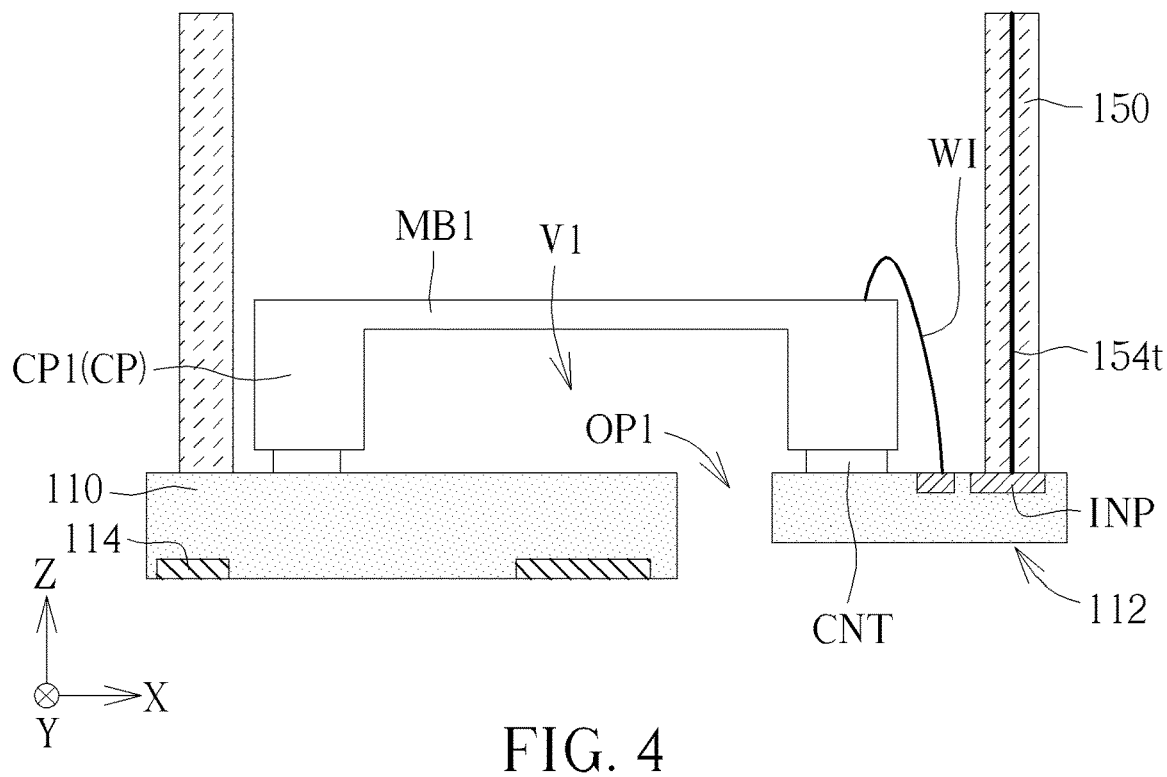

As shown in FIG. 4, in the first packaging method, the first wall 150 is disposed on and connected to the first substrate 110. Similarly, in the second packaging method, the second wall 250 is disposed on and connected to the second substrate 220.

Figure 5:
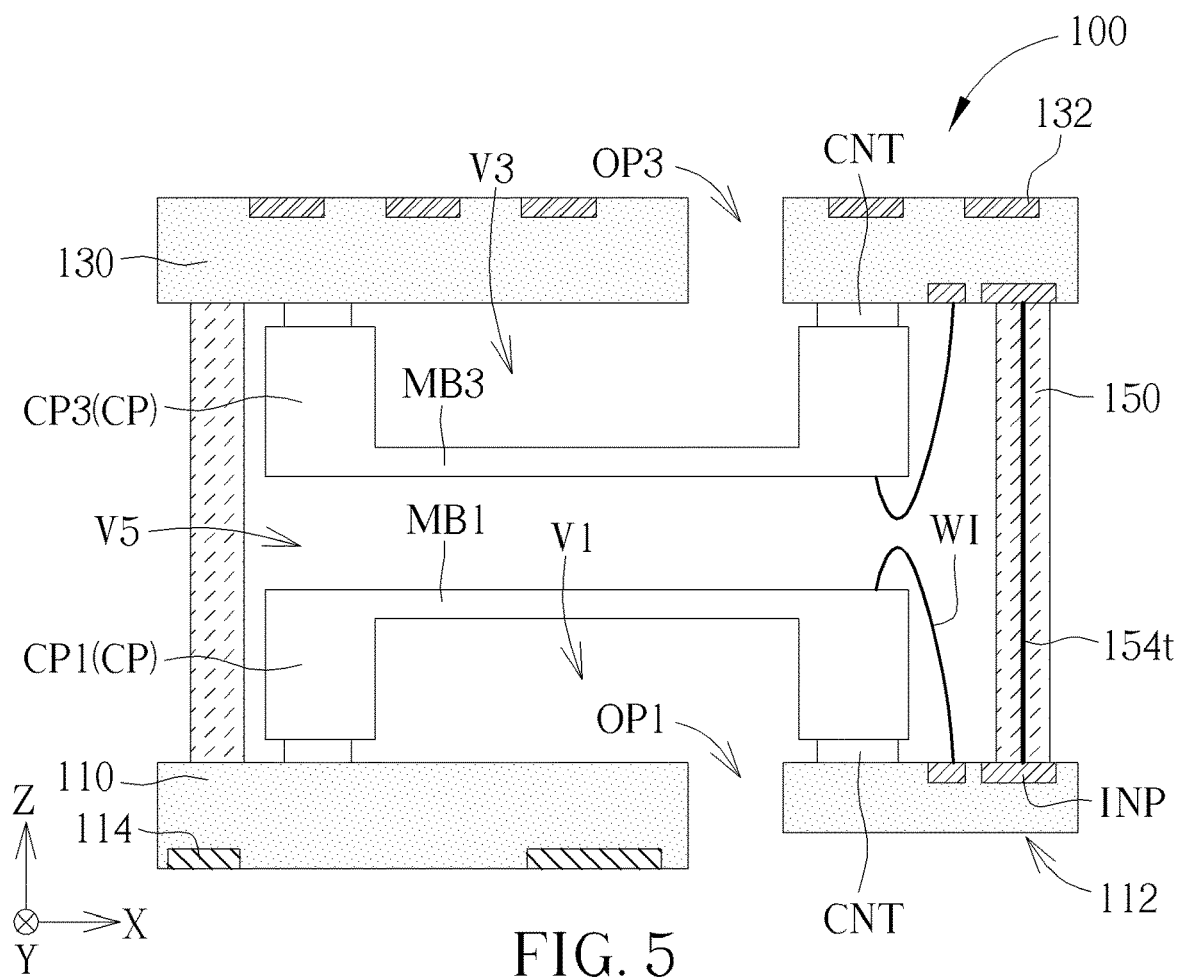

As shown in FIG. 5, in the first packaging method, the third chip CP3 is connected to the third substrate 130 having the third opening OP3, and then, the third substrate 130 is disposed on and connected to the first wall 150, such that the first chip CP1 and the third chip CP3 are between the first substrate 110 and the third substrate 130. Similarly, in the second packaging method, the fourth chip CP4 is connected to the fourth substrate 240 having the fourth opening OP4, and then, the fourth substrate 240 is disposed on and connected to the second wall 250, such that the second chip CP2 and the fourth chip CP4 are between the second substrate 220 and the fourth substrate 240.

Figure 6:
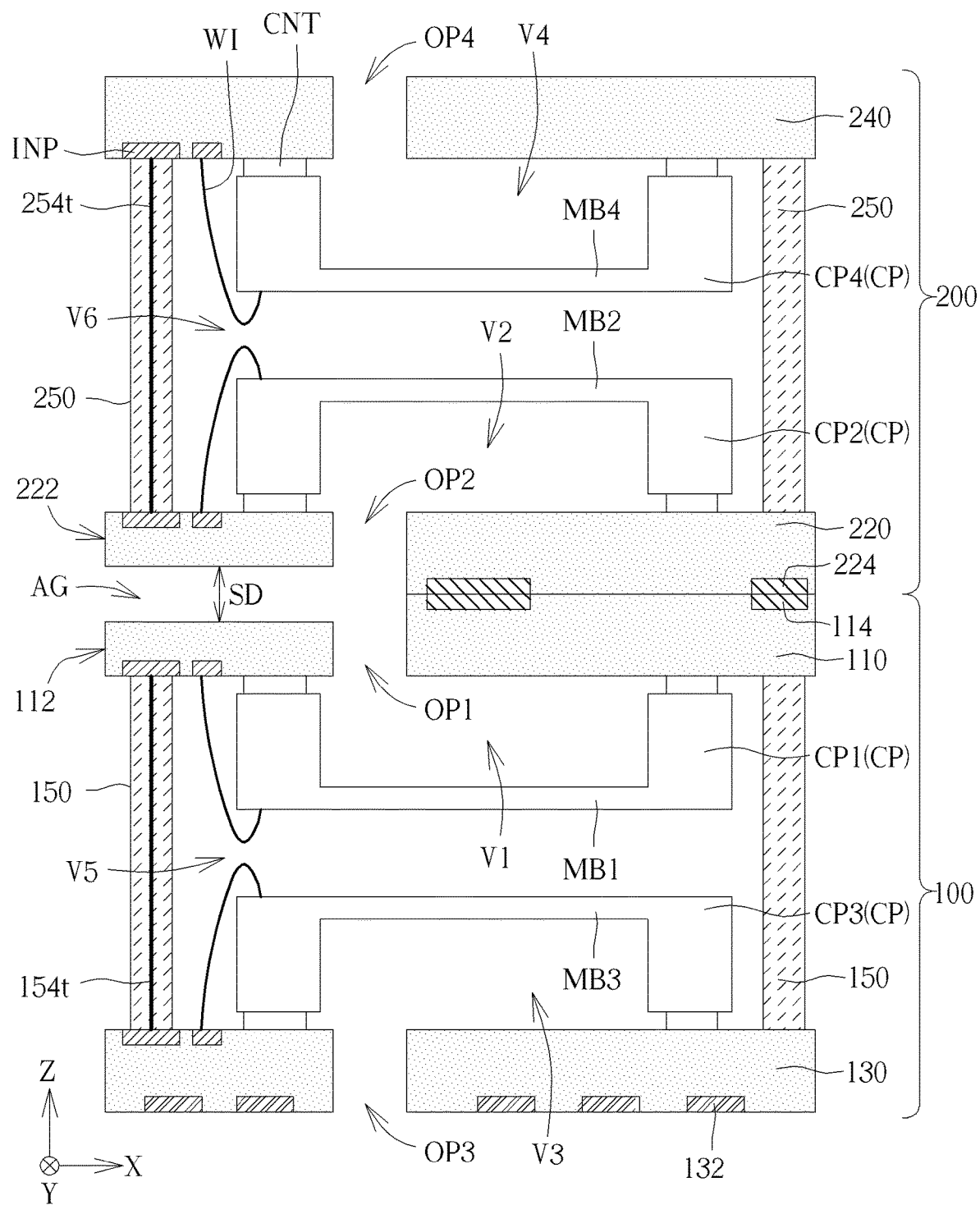

As shown in FIG. 6, the second sub-package structure 200 is disposed on and connected to the first sub-package structure 100, wherein the first substrate 110 is connected to the second substrate 220 through the conductive component (e.g., solder), and the first substrate 110 and the second substrate 220 are between the first chip CP1 and the second chip CP2.

As shown in FIG. 6, a gap AG is formed between the first substrate 110 and the second substrate 220. In this embodiment, the gap AG is formed because of the first thinning portion 112 and the second thinning portion 222. Note that the first thinning portion 112 of the first substrate 110 and the second thinning portion 222 of the second substrate 220 may be formed in any suitable step. For example, the first substrate 110 may be etched to obtain the first thinning portion 112 before disposing the first chip CP1 on the first substrate 110, and the second substrate 220 may be etched to obtain the second thinning portion 222 before disposing the second chip CP2 on the first second substrate 220, but not limited thereto.

As shown in FIG. 1, a cutting process is performed for cutting one first wall 150 to form the first wall opening 152 connected to the cavity V5 and for cutting one second wall 250 to form the second wall opening 252 connected to the cavity V6. In this embodiment, the cutting process may be performed after the second sub-package structure 200 is connected to the first sub-package structure 100.

In another embodiment, the first wall opening 152 and the second wall opening 252 are formed before the second sub-package structure 200 is connected to the first sub-package structure 100. In the first packaging method, after the third substrate 130 is disposed on and connected to the first wall 150 (e.g., the structure in FIG. 5), a first cutting process is performed for cutting one first wall 150 to form the first wall opening 152 connected to the cavity V5. Similarly, in the second packaging method, after the fourth substrate 240 is disposed on and connected to the second wall 250, a second cutting process is performed for cutting one second wall 250 to form the second wall opening 252 connected to the cavity V6.

The sound producing package structure and its manufacturing method of the present invention are not limited by the above embodiments. Other embodiments of the present invention are described below. For ease of comparison, same components will be labeled with the same symbol in the following. The following descriptions relate the differences between each of the embodiments, and repeated parts will not be redundantly described.

Figure 7:
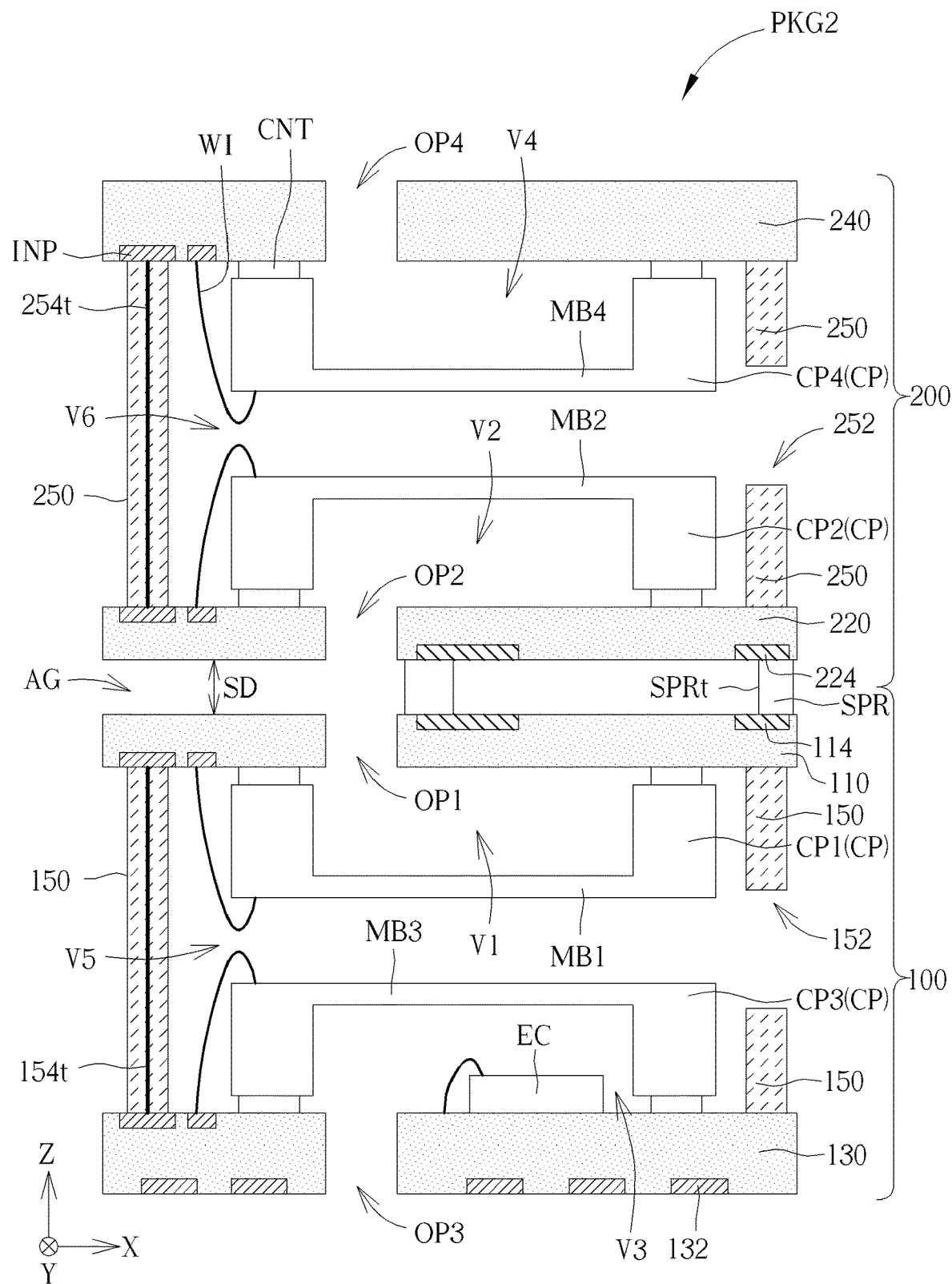
FIG. 7 is a schematic diagram of a cross-sectional view illustrating a sound producing package structure according to a second embodiment of the present invention.

Referring to FIG. 7, FIG. 7 is a schematic diagram of a cross-sectional view illustrating a sound producing package structure according to a second embodiment of the present invention. As shown in FIG. 7, a difference between the first embodiment and this embodiment is the formation of the gap AG. In FIG. 7, the sound producing package structure PKG2 may further include a spacer SPR disposed between the first substrate 110 and the second substrate 220, wherein the first substrate 110 may be connected to the second substrate 220 through the spacer SPR, the first package connecting pad 114 of the first substrate 110 may be electrically connected to the second package connecting pad 224 through the spacer SPR, and the gap AG is formed because of the spacer SPR. The spacer SPR may include a conductive material. For example, the spacer SPR may be a conductive component (e.g., solder), a substrate including at least one conductive layer (e.g., a circuit board) or other suitable spacer. In FIG. 7, for instance, the spacer SPR may be a substrate including at least one spacer trace SPRt, the first package connecting pad 114 may be electrically connected to the spacer trace SPRt through a conductive component (e.g., solder) disposed between the first substrate 110 and the spacer SPR, and the second package connecting pad 224 may be electrically connected to the spacer trace SPRt through a conductive component (e.g., solder) disposed between the second substrate 220 and the spacer SPR, such that the first package connecting pad 114 and the second package connecting pad 224 may be electrically connected to each other through the conductive components and the spacer trace SPRt, but not limited thereto.

Due to the existence of the spacer SPR, a distance SD between the first substrate 110 and the second substrate 220 may be greater than a specific value (e.g., 300 µm), so as to form the gap AG connected to the first opening OP1 and the second opening OP2. For example, in FIG. 7, the spacer SPR which is the substrate may have a thickness greater than 400 µm, but not limited thereto.

Regarding the manufacturing method of the sound producing package structure PKG2, in the step of connecting the second sub-package structure 200 and the first sub-package structure 100, the spacer SPR may be connected to the first sub-package structure 100, and then, the spacer SPR may be connected to the second sub-package structure 200. Namely, the spacer SPR may be disposed between the first substrate 110 of the first sub-package structure 100 and the second substrate 220 of the second sub-package structure 200.

Moreover, in FIG. 7, the sound producing package structure PKG2 may further include an electronic component EC disposed between the first substrate 110 and the third substrate 130 (i.e., the electronic component EC is disposed within the first sub-package structure 100), and the electronic component EC may overlap the first membrane MB1 in the normal direction of the first substrate 110 (i.e., the direction Z). The electronic component EC may comprise a passive component, an integrated circuit chip (e.g., application-specific integrated circuit (ASIC) chip) or other suitable electronic component.

Figure 8:
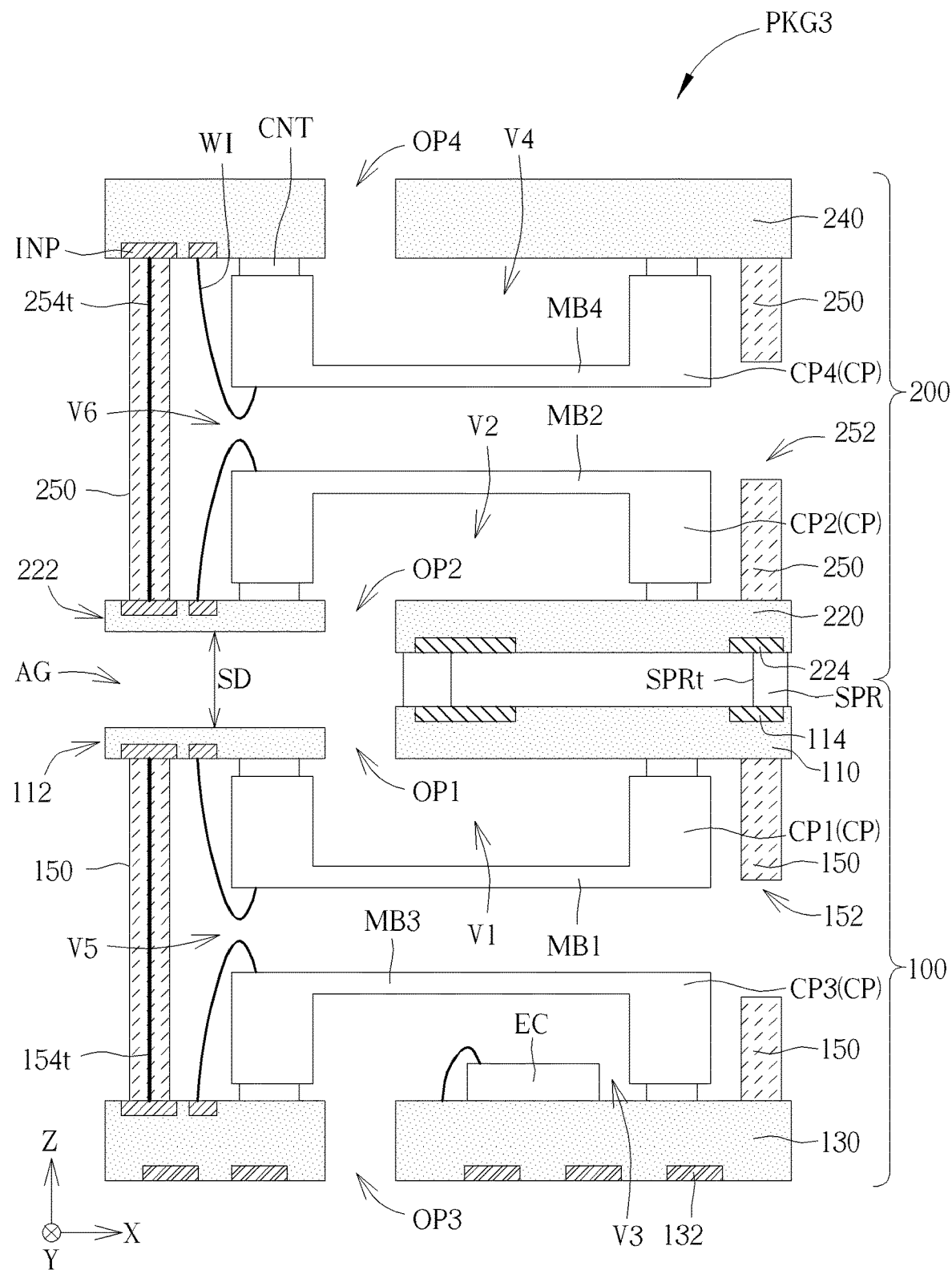
FIG. 8 is a schematic diagram of a cross-sectional view illustrating a sound producing package structure according to a third embodiment of the present invention.

Referring to FIG. 8, FIG. 8 is a schematic diagram of a cross-sectional view illustrating a sound producing package structure according to a third embodiment of the present invention. As shown in FIG. 8, a difference between the first embodiment and this embodiment is the formation of the gap AG. In FIG. 8, the sound producing package structure PKG3 may include the spacer SPR disposed between the first substrate 110 and the second substrate 220, the first substrate 110 may have the first thinning portion 112, and the second substrate 220 may have the second thinning portion 222, such that the gap AG may be formed because of the spacer SPR, the first thinning portion 112 and the second thinning portion 222.

Figure 9:
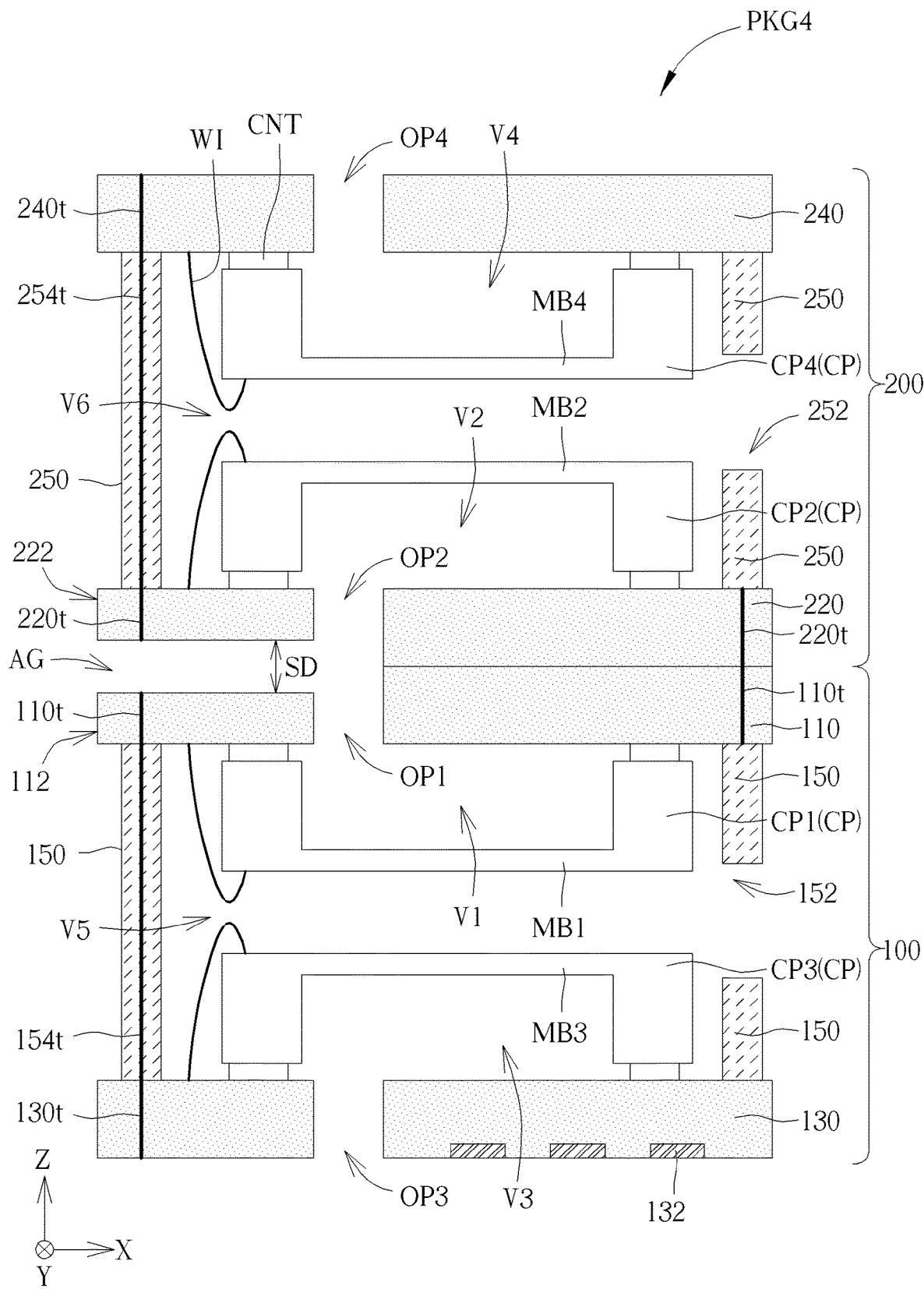
FIG. 9 is a schematic diagram of a cross-sectional view illustrating a sound producing package structure according to a fourth embodiment of the present invention.

Referring to FIG. 9, FIG. 9 is a schematic diagram of a cross-sectional view illustrating a sound producing package structure according to a fourth embodiment of the present invention. As shown in FIG. 9, a difference between the first embodiment and this embodiment is the design of the electrical connection. In the sound producing package structure PKG4, one trace 110t of the first substrate 110 and one trace 130t of the third substrate 130 may be electrically connected to the first connecting line 154t of the first wall 150, and one trace 220t of the second substrate 220 and one trace 240t of the fourth substrate 240 may be electrically connected to the second connecting line 254t of the second wall 250. Furthermore, another trace 110t of the first substrate 110 may be electrically connected to another trace 220t of the second substrate 220. For example, the trace 110t may pass through the first substrate 110, the trace 220t may pass through the second substrate 220, the trace 130t may pass through the third substrate 130, and the trace 240t may pass through the fourth substrate 240, but not limited thereto. Note that these traces and these connecting lines may be electrically connected to each other through the conductive components (e.g., solder), but not limited thereto.

In an embodiment, all of the chips CP may be electrically connected to the outer connecting pad 132 of the third substrate 130 through the trace(s) in the substrate(s) and/or the connecting line(s) in the wall.

Figure 10:
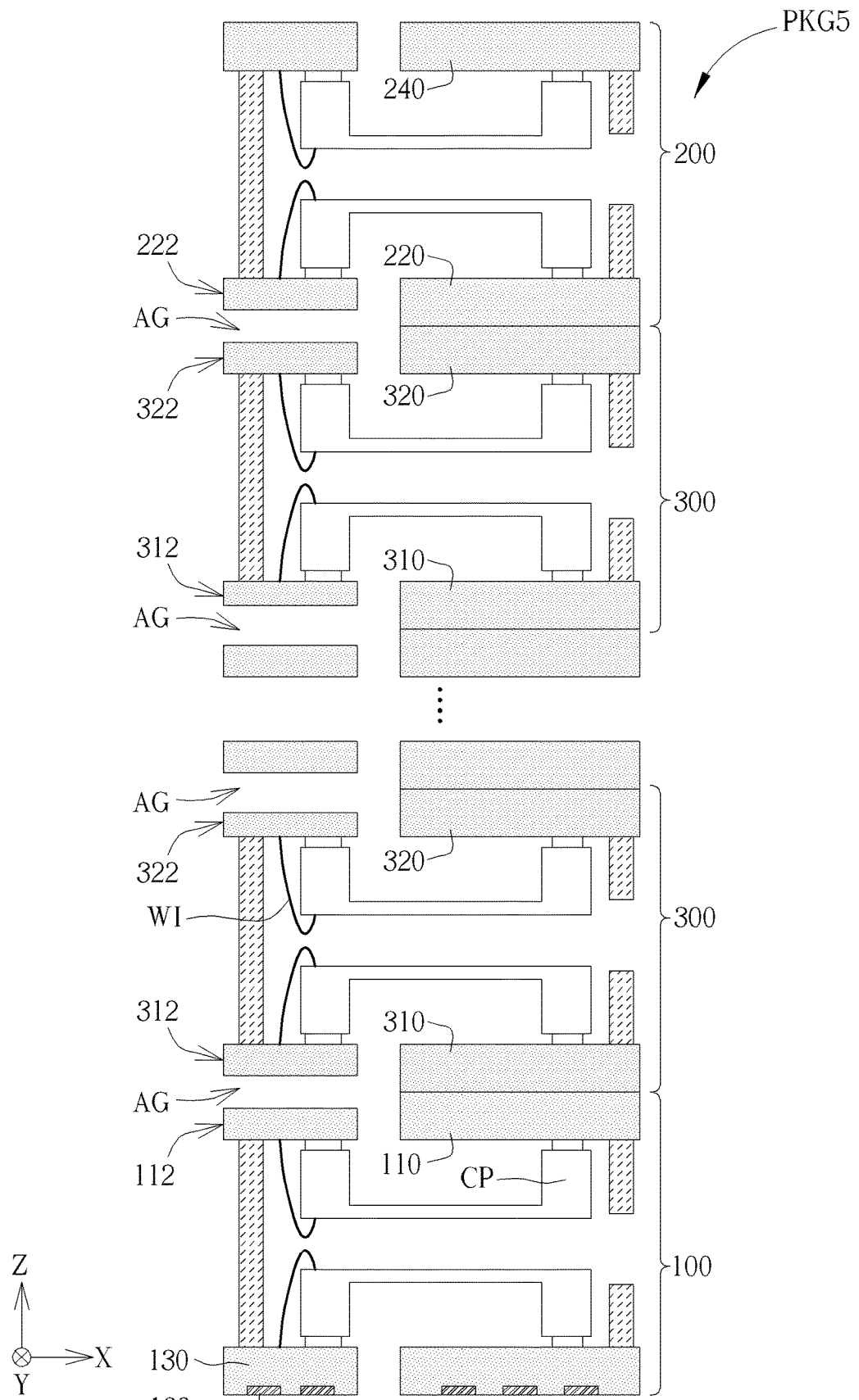
FIG. 10 is a schematic diagram of a cross-sectional view illustrating a sound producing package structure according to a fifth embodiment of the present invention.

Referring to FIG. 10, FIG. 10 is a schematic diagram of a cross-sectional view illustrating a sound producing package structure according to a fifth embodiment of the present invention. As shown in FIG. 10, a difference between the first embodiment and this embodiment is the number of the sub-package structures. In the sound producing package structure PKG5 of this embodiment, the number of the stacked sub-package structures may be greater than 2, and a plurality of gaps AG connected to the ambient of the sound producing package structure PKG5 may be formed between the sub-package structures, wherein the design of the sub-package structure and the design of the gap AG may be the same as or similar to the above embodiment(s).

For example, the sub-package structures may include one first sub-package structure 100, one second sub-package structure 200 and at least one third sub-package structure 300, wherein the third sub-package structure(s) 300 may be disposed between the first sub-package structure 100 and the second sub-package structure 200, and each gap AG may be formed between two adjacent sub-package structures, but not limited thereto. For example, the third sub-package structure 300 may include a fifth substrate 310, a sixth substrate 320 and a plurality of chips CP (e.g., two chips CP) disposed between the fifth substrate 310 and the sixth substrate 320. All of the chips CP in the sound producing package structure PKG5 may be electrically connected to the outer connecting pad 132 of the third substrate 130 through at least one trace of the substrate(s) and/or at least one conductive line of the wall(s).

For example, in FIG. 10, the gap AG may be formed because of the thinning portion(s) of the substrate(s). As shown in FIG. 10, one gap AG may be formed between the first thinning portion 112 of the first substrate 110 of the first sub-package structure 100 and a third thinning portion 312 of the fifth substrate 310 of the third sub-package structure 300, and another gap AG may be formed between the second thinning portion 222 of the second substrate 220 of the second sub-package structure 200 and a fourth thinning portion 322 of the sixth substrate 320 of the third sub-package structure 300. In FIG. 10, at least one gap AG may be formed between the third thinning portion 312 of the fifth substrate 310 of the third sub-package structure 300 and the fourth thinning portion 322 of the sixth substrate 320 of the third sub-package structure 300.

In summary, according to the present invention, the yield rate and the reliability of the sound producing package structure are enhanced, and the SPL of the acoustic wave produced by the sound producing package structure is increased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A sound producing package structure, comprising:
   a first sub-package structure comprising:
      a first substrate having a first opening; and
      a first chip comprising a first membrane and connected to the first substrate, wherein a first cavity is formed between the first membrane and the first substrate; and
   a second sub-package structure, disposed on the first sub-package structure, wherein the first sub-package structure and the second sub-package structure are stacked, and the second sub-package structure comprises:
      a second substrate connected to the first substrate and having a second opening, wherein the second opening and the first opening are connected; and
      a second chip comprising a second membrane and connected to the second substrate, wherein a second cavity is formed between the second membrane and the second substrate;
   wherein a gap, connected to the first opening and the second opening, is formed between the first substrate and the second substrate, such that an ambient of the sound producing package structure, the first cavity and the second cavity are connected.

2. The sound producing package structure of claim 1, wherein the first substrate has a first thinning portion adjacent to the first opening, and the gap is formed because of the first thinning portion.

3. The sound producing package structure of claim 2, wherein the second substrate has a second thinning portion adjacent to the second opening, and the gap is formed between the first thinning portion and the second thinning portion.

4. The sound producing package structure of claim 1, further comprising a spacer disposed between the first substrate and the second substrate, wherein the gap is formed because of the spacer.

5. The sound producing package structure of claim 1, wherein the first sub-package structure further comprises:
   a third substrate having a third opening; and
   a third chip comprising a third membrane and connected to the third substrate, wherein a third cavity is formed between the third membrane and the third substrate;
wherein the third opening is connected to the third cavity.

6. The sound producing package structure of claim 5, wherein a fourth cavity is formed between the first membrane and the third membrane;
wherein the fourth cavity is isolated from the first cavity because of the first chip;
wherein the fourth cavity is isolated from the third cavity because of the third chip.

7. The sound producing package structure of claim 6, wherein a first wall opening is formed within the first sub-package structure and serves as a sound outlet of the first sub-package structure;

wherein the first wall opening and the fourth cavity are connected.

8. The sound producing package structure of claim 7, wherein the first sub-package structure comprises:
at least one first wall, disposed between the first substrate and the third substrate;
wherein the first wall opening is formed within one of the at least one first wall.

9. The sound producing package structure of claim 7, wherein the first membrane and the third membrane are configured to generate a first acoustic wave within the fourth cavity;
wherein the first acoustic wave propagates through the first wall opening and toward a first direction.

10. The sound producing package structure of claim 9, wherein an air wave within the first cavity propagates through the first opening and the gap and toward a second direction;
wherein the second direction is opposite to the first direction.

11. The sound producing package structure of claim 9, wherein an air wave within the third cavity propagates through the third opening and toward a third direction;
wherein the third direction is substantially perpendicular to the first direction.

12. The sound producing package structure of claim 5, wherein the second sub-package structure further comprises:
a fourth substrate having a fourth opening; and
a fourth chip comprising a fourth membrane and connected to the fourth substrate, wherein a fifth cavity is formed between the fourth membrane and the fourth substrate;
wherein the fourth opening is connected to the fifth cavity.

13. The sound producing package structure of claim 12, wherein a sixth cavity is formed between the second membrane and the fourth membrane;
wherein the sixth cavity is isolated from the second cavity because of the second chip;
wherein the sixth cavity is isolated from the fifth cavity because of the fourth chip.

14. The sound producing package structure of claim 13, wherein a second wall opening is formed within the second sub-package structure and serves as a sound outlet of the second sub-package structure;
wherein the second wall opening and the sixth cavity are connected.

15. The sound producing package structure of claim 14, wherein the second sub-package structure comprises:
at least second wall, disposed between the second substrate and the fourth substrate;
wherein the second wall opening is formed within one of the at least one second wall.

16. The sound producing package structure of claim 14, wherein the second membrane and the fourth membrane are configured to generate a second acoustic wave within the sixth cavity;
wherein the second acoustic wave propagates through the second wall opening and toward a first direction.

17. The sound producing package structure of claim 16, wherein an air wave within the second cavity propagates through the second opening and the gap and toward a second direction;
wherein the second direction is opposite to the first direction.

18. The sound producing package structure of claim 16, wherein an air wave within the fifth cavity propagates through the fourth opening and toward a fourth direction;
wherein the fourth direction is substantially perpendicular to the first direction.

19. The sound producing package structure of claim 12, wherein an acoustic wave is generated within the sound producing package structure, and the acoustic wave propagates through a wall opening toward a first direction;
wherein a first air wave within the third cavity propagates through the third opening and toward a third direction;
wherein a second air wave within the fifth cavity propagates through the fourth opening and toward a fourth direction;
wherein the fourth direction is opposite to the third direction;
wherein the third direction and the fourth direction are substantially perpendicular to the first direction.

20. The sound producing package structure of claim 1, comprising:
a plurality of sub-package structures;
wherein the plurality of sub-package structures comprise the first sub-package structure and the second sub-package structure;
wherein the sub-package structures are stacked;
wherein a plurality of gaps are formed between the plurality of sub-package structures;
wherein the ambient and the plurality of gaps are connected.

21. The sound producing package structure of claim 1, comprising:
a plurality of chips;
wherein the plurality of chips comprise the first chip and the second chip;
wherein the first sub-package structure comprises:
a third substrate and an outer connecting pad;
wherein the outer connecting pad is formed within the third substrate;
wherein the plurality of chips is electrically connected to the outer connecting pad.

22. The sound producing package structure of claim 1, comprising:
an electronic component disposed within the first sub-package structure.

23. A manufacturing method of a sound producing package structure, comprising:
manufacturing a first sub-package structure, wherein manufacturing the first sub-package structure comprises:
disposing a first chip on a first substrate, wherein a first opening is formed within the first substrate, and a first cavity is formed between a first membrane of the first chip and the first substrate;
manufacturing a second sub-package structure, wherein manufacturing the second sub-package structure comprises:
disposing a second chip on a second substrate, wherein a second opening is formed within the second substrate, and a second cavity is formed between a second membrane of the second chip and the second substrate;
connecting the second sub-package structure to the first sub-package structure, wherein the first substrate is connected to the second substrate, and the first substrate and the second substrate are between the first chip and the second chip; and forming a gap between the first substrate and the second substrate;

wherein the gap is connected to the first opening and the second opening, such that an ambient of the sound producing package structure, the first cavity and the second cavity are connected.

24. The method of claim 23, wherein the step of forming the gap comprises:

etching the first substrate to obtain a first thinning portion;

wherein the gap is formed because of the first thinning portion.

25. The method of claim 24, wherein the step of forming the gap comprises:

etching the second substrate to obtain a second thinning portion;

wherein the gap is formed between the first thinning portion and the second thinning portion.

26. The method of claim 23, wherein the step of forming the gap comprises:

disposing a spacer between the first substrate and the second substrate;

wherein the gap is formed because of the spacer between the first substrate and the second substrate.

* * * * *